United States Patent
Ryu et al.

(10) Patent No.: US 9,017,921 B2
(45) Date of Patent: Apr. 28, 2015

(54) PHOTORESIST COMPOSITION AND METHOD OF FORMING A BLACK MATRIX USING THE SAME

(71) Applicant: Samsung Display Co., Ltd., Yongin, Gyeonggi-do (KR)

(72) Inventors: Soo-Hye Ryu, Yongin-si (KR); Yi-Seop Shim, Suwon-si (KR); Chang-soon Jang, Seoul (KR); Chul Huh, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 113 days.

(21) Appl. No.: 13/853,395

(22) Filed: Mar. 29, 2013

(65) Prior Publication Data

US 2014/0065542 A1 Mar. 6, 2014

(30) Foreign Application Priority Data

Sep. 5, 2012 (KR) .................. 10-2012-0098439

(51) Int. Cl.
| | |
|---|---|
| G03F 7/004 | (2006.01) |
| G03C 1/00 | (2006.01) |
| C09D 11/00 | (2014.01) |
| C09B 31/02 | (2006.01) |
| C09B 69/10 | (2006.01) |
| G03F 7/20 | (2006.01) |
| G03C 1/52 | (2006.01) |
| C09D 11/328 | (2014.01) |

(52) U.S. Cl.
CPC .. *G03F 7/20* (2013.01); *G03C 1/52* (2013.01); *C09B 69/10* (2013.01); *C09D 11/328* (2013.01); *G03F 7/004* (2013.01)

(58) Field of Classification Search
CPC .......... C09B 69/10; G03F 7/004; G03F 7/20; G03F 7/30; G03C 1/52; G03C 67/0055; C09D 11/328; D06P 1/38; D06P 3/8252
USPC ......... 430/270.1, 281.1, 322, 325; 106/31.43, 106/31.5; 534/797; 8/647
See application file for complete search history.

(56) References Cited

U.S. PATENT DOCUMENTS

| | | | | |
|---|---|---|---|---|
| 4,189,380 A | * | 2/1980 | Booth et al. | 210/651 |
| 4,375,357 A | * | 3/1983 | Wingard et al. | 8/647 |
| 4,619,998 A | * | 10/1986 | Buhr | 544/193.1 |
| 4,955,987 A | * | 9/1990 | Lacroix et al. | 8/549 |
| 5,532,111 A | * | 7/1996 | Holmes et al. | 430/281.1 |
| 5,534,052 A | * | 7/1996 | Mennicke et al. | 106/31.43 |
| 5,684,139 A | * | 11/1997 | Wild et al. | 534/797 |
| 5,741,620 A | * | 4/1998 | Holmes et al. | 430/253 |
| 5,780,201 A | * | 7/1998 | Sabnis et al. | 430/270.1 |
| 5,780,602 A | * | 7/1998 | Schumacher et al. | 534/642 |
| 5,785,748 A | * | 7/1998 | Banford et al. | 106/443 |
| 5,879,439 A | * | 3/1999 | Nagai et al. | 106/31.28 |

(Continued)

FOREIGN PATENT DOCUMENTS

| | | | | |
|---|---|---|---|---|
| JP | 63020567 A | * | 1/1988 | |
| JP | 2005008746 A | * | 1/2005 | |

(Continued)

*Primary Examiner* — Amanda C Walke
(74) *Attorney, Agent, or Firm* — F. Chau & Associates, LLC

(57) ABSTRACT

A photoresist composition includes a binder resin combined with a black dye, a monomer, a photo-polymerization initiator and a remainder of a solvent.

18 Claims, 3 Drawing Sheets

(56) References Cited

U.S. PATENT DOCUMENTS

| | | | |
|---|---|---|---|
| 5,998,090 A | 12/1999 | Sabnis et al. | |
| 6,126,700 A * | 10/2000 | Bao-Kun et al. | 8/549 |
| 6,306,182 B1 * | 10/2001 | Chan et al. | 8/426 |
| 7,387,667 B1 * | 6/2008 | Lin et al. | 106/31.48 |
| 7,524,368 B2 * | 4/2009 | Lee et al. | 106/31.52 |
| 7,704,309 B2 * | 4/2010 | Wright | 106/31.48 |
| 7,732,509 B2 * | 6/2010 | Madaras | 523/160 |
| 8,575,288 B2 * | 11/2013 | Hayashi et al. | 526/303.1 |
| 2002/0182522 A1 | 12/2002 | Sabnis et al. | |
| 2006/0089421 A1 * | 4/2006 | Vasudevan | 523/160 |
| 2008/0122915 A1 * | 5/2008 | Madaras | 347/100 |
| 2008/0250969 A1 * | 10/2008 | Ganapathiappan et al. | 106/31.57 |
| 2009/0280416 A1 * | 11/2009 | Einaga et al. | 430/7 |
| 2010/0072889 A1 * | 3/2010 | Takahashi et al. | 313/504 |
| 2010/0247752 A1 * | 9/2010 | Hayashi et al. | 427/127 |
| 2011/0151379 A1 * | 6/2011 | Choi et al. | 430/270.1 |
| 2012/0243099 A1 * | 9/2012 | Kaneko | 359/611 |
| 2013/0261213 A1 * | 10/2013 | Park et al. | 522/111 |
| 2014/0011135 A1 * | 1/2014 | Park et al. | 430/283.1 |

FOREIGN PATENT DOCUMENTS

| | | | |
|---|---|---|---|
| JP | 2005035164 A | * | 2/2005 |
| JP | 2005200553 A | * | 7/2005 |
| JP | 2005298803 A | * | 10/2005 |
| JP | 2007314602 A | * | 12/2007 |
| KR | 1020080067816 | | 7/2008 |

* cited by examiner

PHOTORESIST COMPOSITION AND METHOD OF FORMING A BLACK MATRIX USING THE SAME

This application claims priority to Korean Patent Application No. 10-2012-0098439, filed on Sep. 5, 2012, the disclosure of which is hereby incorporated by reference herein in its entirety.

TECHNICAL FIELD

Embodiments of the present invention relate to a photoresist composition and a method of forming a black matrix using the photoresist composition. More particularly, embodiments of the present invention relate to a photoresist composition, which may be used for forming a black matrix of a display panel, and a method of forming a black matrix using the photoresist composition.

DISCUSSION OF THE RELATED ART

Generally, a liquid crystal display panel includes an upper substrate, a lower substrate and a liquid crystal layer interposed between the upper substrate and the lower substrate. The liquid crystal display panel uses an electric field formed by a pixel electrode and a common electrode to align the liquid crystal layer so that a light transmittance may be controlled to display an image.

To improve a contrast of an image, the liquid crystal display panel may include, for example, a black matrix formed on the upper substrate or the lower substrate. The black matrix may have, for example, a black color to absorb a light incident thereon. The black matrix may include a pigment such as, for example, a carbon black or a black dye so that the black matrix has a black color.

However, the black matrix including a carbon black may have a relatively low adhesion to a substrate. Thus, the black matrix may be readily separated from the substrate. Furthermore, the black matrix including a carbon black may have a relatively low resistance, which may in turn form a parasitic capacitance or may cause a noise of a pixel voltage.

Furthermore, when the black matrix includes a black dye, the black dye may not have direct combination with a binder resin. Thus, as a result, the reliability of the black matrix may be reduced, and it may be difficult for the black matrix to have a sufficient optical density.

SUMMARY

An exemplary embodiment provides a photoresist composition capable of forming a black matrix with increased reliability.

An exemplary embodiment also provides a method of forming a black matrix using the photoresist composition.

According to an exemplary embodiment, a photoresist composition includes a binder resin combined with a black dye, a monomer, a photo-polymerization initiator and a remainder of a solvent.

In an embodiment, the binder resin includes an acryl resin having a weight-average molecular weight of about 10,000 to about 100,000.

In an embodiment, the binder resin is a product of polymerization of an acryl-based monomer and a reactive black dye.

In an embodiment, the acryl-based monomer includes at least one selected from the group consisting of methacrylic acid, acrylic acid, crotonic acid, maleic acid, vinyl pyrrolidone, styrene monomer, methyl methacrylate, benzyl methacrylate, 2-hydroxyethyl methacrylate, an aryl methacrylate, and glycidyl methacrylate.

In an embodiment, the reactive black dye includes at least one selected from the group consisting of compounds represented by following Chemical Formulas 1 to 3, wherein $R_1$, $R_2$, $R_3$, and $R_4$ independently represent —$NR_5R_6$, —$OR_7$, —$CR_8$=$CR_9R_{10}$ or —$OC(=O)CR_{11}$=$CR_{12}R_{13}$, $R_5$ to $R_{13}$ independently represent a hydrogen atom or an alkyl group having carbon atoms of 1 to 5, and at least one hydrogen atoms of the alkyl group may be substituted with an alkyl group having carbon atoms of 1 to 20, an alkoxyl group having carbon atoms of 1 to 30, an aryl group having carbon atoms of 6 to 30 or an aryloxyl group having carbon atoms of 6 to 30.

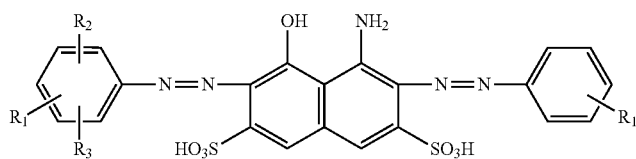

<Chemical Formula 1>

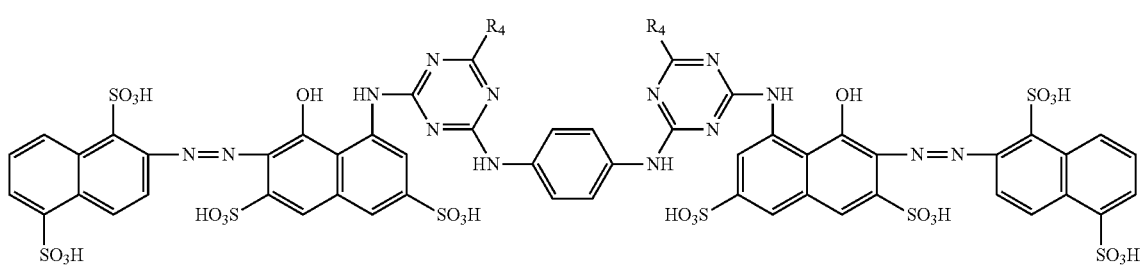

<Chemical Formula 2>

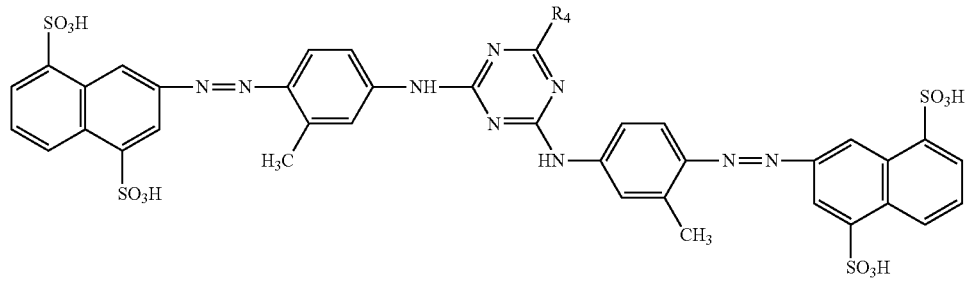

<Chemical Formula 3>

In an embodiment, the binder resin is represented by following Chemical Formula 4, wherein in, n, p and q represents mole fractions of corresponding repeating units, and sum of m, n, p and q is 100, and m, n, p and q are integers more than 0, and $R_1$ represents —OCOCH=CHCH$_3$, and $R_2$ and $R_3$ independently represent —NR$_5$R$_6$, —OR$_7$, —CR$_8$=CR$_9$R$_{10}$ or —OC(=O)CR$_{11}$=CR$_{12}$R$_{13}$, and $R_5$ to $R_{13}$ independently represent a hydrogen atom or an alkyl group having carbon atoms of 1 to 5, and at least one hydrogen atoms of the alkyl group may be substituted with an alkyl group having carbon atoms of 1 to 20, an alkoxyl group having carbon atoms of 1 to 30, an aryl group having carbon atoms of 6 to 30 or an aryloxyl group having carbon atoms of 6 to 30.

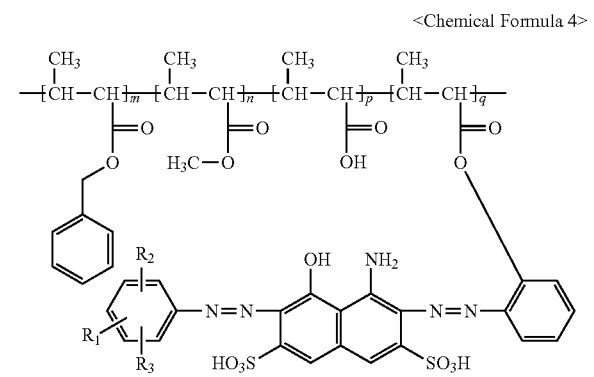

<Chemical Formula 4>

In an embodiment, the monomer includes at least one selected from the group consisting of dipentaerythritol hexaacrylate, pentaerythritol triacrylate, pentaerythritol tetraacrylate, trimethylpropane triacrylate, trimethylpropane trimethacrylate, glycerol triacrylate, tris(2-hydroxyethyl)isocyanurate triacrylate, di-trimethylpropane tetraacrylate, dipentaerythritol pentaacrylate, pentaerythritol tetraacrylate, glycidyl methacrylate, hydroxyethyl methacrylate, 2-hydroxy-3-phenoxypropyl acrylate, diethylene glycol methyl ether methacrylate, hydroxyethyl acrylate, butyl methacrylate, hydroxypropyl acrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate, and tridecyl acrylate.

In an embodiment, the photo-polymerization initiator includes at least one selected from the group consisting of an acetophenone-based compound, a benzophenone-based compound and an oxime-based compound.

In an embodiment, the photoresist composition further includes a black pigment.

In an embodiment, the black pigment includes at least one selected from the group consisting of carbon black, titanium black, acetylene black, aniline black, perylene black, strontium titanium oxide, chromium oxide, and ceria.

In an embodiment, the photoresist composition further includes at least one selected from the group consisting of a dispersing agent, a surfactant and an adhesion enhancer In an embodiment, an amount of the binder resin combined with black dye is about 3% by weight to about 10% by weight, an amount of the monomer is about 2% by weight to about 10% by weight, an amount of the photo-polymerization initiator is about 0.5% by weight to about 5% by weight.

According to an exemplary embodiment, a photoresist composition includes a binder resin, a reactive black dye, a monomer, a photo-polymerization initiator and a remainder of a solvent.

According to an exemplary embodiment, a method of forming a black matrix is provided. In the method, a photoresist composition including a binder resin combined with a black dye, a monomer, a photo-polymerization initiator and a remainder of a solvent is disposed on a base substrate to form a coated layer thereon. The coated layer is exposed to a light. The coated layer is developed to form a photoresist pattern.

According to an exemplary embodiment, a method of forming a black matrix is provided. In the method, a photoresist composition including a binder resin, a reactive black dye, a monomer, a photo-polymerization initiator and a remainder of a solvent is disposed on a base substrate to form a coated layer. The coated layer is exposed to a light. The coated layer is developed to form a photoresist pattern.

According to exemplary embodiments, the photoresist composition includes a binder resin combined with a black dye or a reactive black dye that can be combined with a binder resin. Thus, the black dye may be prevented from being separated from the binder resin and the coated layer. Thus, a heat resistance, a light resistance and a chemical resistance of a black matrix may be increased.

Furthermore, the photoresist composition according to an exemplary embodiment may not use a black pigment or may use a reduced amount of the black pigment. Thus, the straightability, the profile, and an adhesion to a substrate of a black matrix may be increased, and the black matrix may have a high electric resistance.

BRIEF DESCRIPTION OF THE DRAWINGS

Exemplary embodiments of the present invention can be understood in further detail from the following detailed description taken in conjunction with the accompanying drawings, in which.

DETAILED DESCRIPTION OF EXEMPLARY EMBODIMENTS

Figure 1:
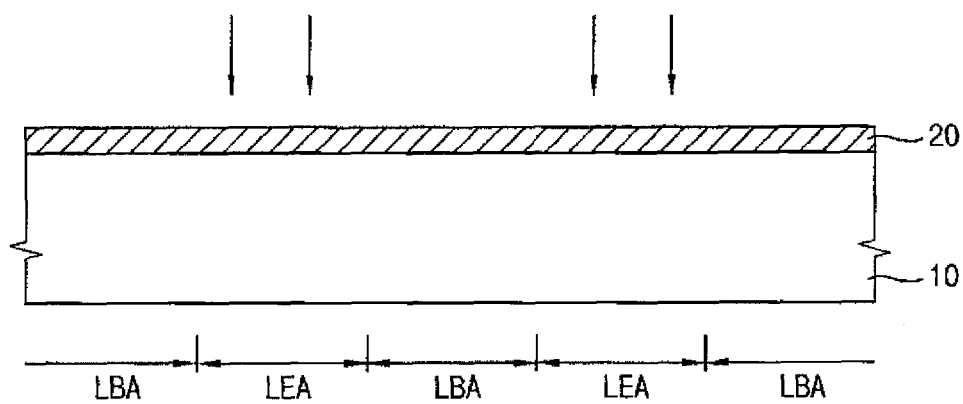
FIGS. 1 to 4 are cross-sectional views illustrating a method of manufacturing a black matrix and a display substrate according to an exemplary embodiment of the present invention.

A photoresist composition and a method of forming a black matrix using the photoresist composition according to exemplary embodiments will hereinafter be described in further detail with reference to the accompanying drawings.

The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. As used herein, the term "and/or" includes any and all combinations of one or more of the associated listed items.

It will also be understood that when a layer is referred to as being "on" another layer or substrate, it can be directly on the other layer or substrate, or intervening layers may also be present.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Photoresist Composition

A photoresist composition according to an exemplary embodiment may include, for example, a binder resin combined with a black dye, a monomer, a photo-polymerization initiator, and a solvent. The photoresist composition may further include, for example, at least one of a pigment, a dispersing agent, a surfactant and an adhesion enhancer.

Hereinafter, the above components of the photoresist composition will be respectively described in further detail.

(a) Binder Resin

The binder resin combined with the black dye may include, for example, an acrylic resin. A weight-average molecular weight of the acrylic resin may be, for example, from about 10,000 to about 100,000 Daltons (Da) so that the photoresist composition may be stably coated on a substrate and have a suitable density.

The acrylic resin may be formed by, for example, polymerization of an acryl-based monomer and a reactive black dye. Examples of the acryl-based monomer forming the acrylic resin may include, for example, at least one selected from methacrylic acid, acrylic acid, crotonic acid, maleic acid, vinyl pyrrolidone, a styrene monomer, methyl methacrylate, benzyl methacrylate, 2-hydroxyethyl methacrylate, an aryl methacrylate (e.g., phenyl methacrylate), glycidyl methacrylate, and the like. These monomers may be used alone or in a combination thereof. Thus, the acrylic resin may be a copolymer formed by, for example, polymerization of at least two different monomers.

Examples of the reactive black dye may include compounds represented by, for example, the following Chemical Formulas 1, 2, and 3.

<Chemical Formula 1>

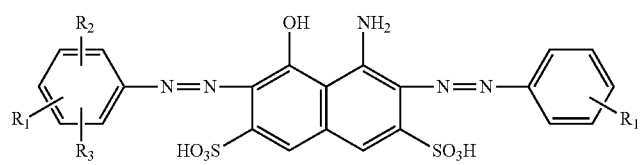

<Chemical Formula 2>

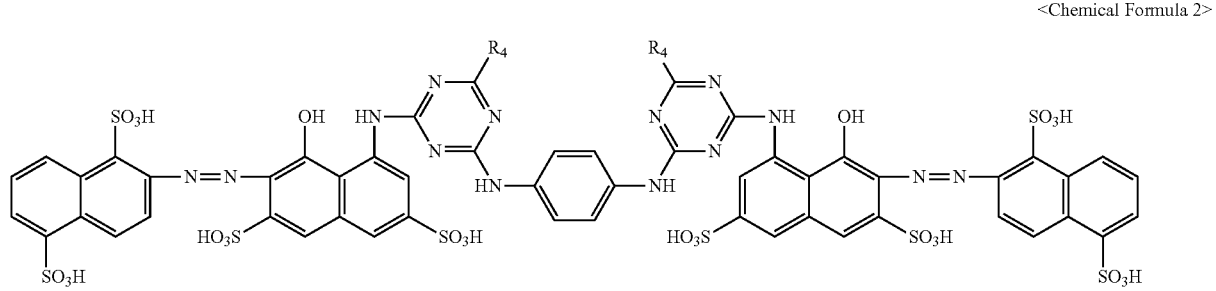

<Chemical Formula 3>

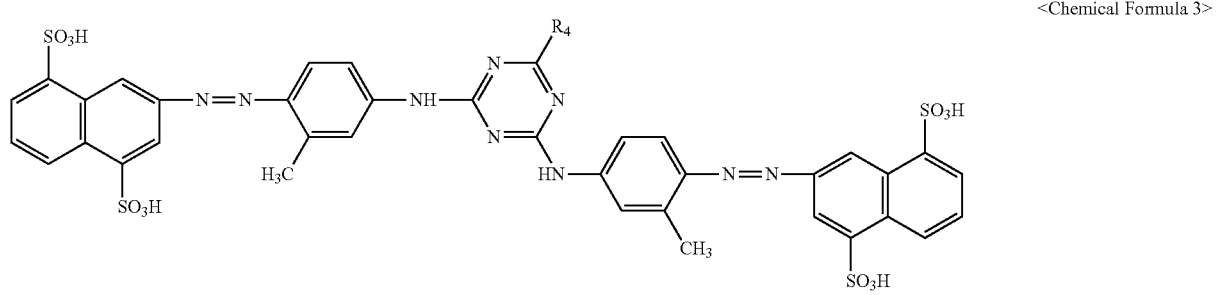

For example, in Chemical Formulas 1 to 3, $R_1$, $R_2$, $R_3$, and $R_4$ independently represent —$NR_5R_6$, —$OR_7$, —$CR_8$=$CR_9R_{10}$ or —OC(=O)$CR_{11}$=$CR_{12}R_{13}$. $R_5$ to $R_{13}$ independently represent, for example, a hydrogen atom or an alkyl group having carbon atoms of 1 to 5. At least one hydrogen atoms of the alkyl group may be substituted with, for example, an alkyl group having carbon atoms of 1 to 20, an alkoxyl group having carbon atoms of 1 to 30, an aryl group having carbon atoms of 6 to 30 or an aryloxyl group having carbon atoms of 6 to 30.

For example, in Chemical Formulas 1 to 3, $R_1$, $R_2$, $R_3$, and $R_4$ are reactive functional groups that can be combined with the acryl-based monomer or a polymer formed from polymerization of the acryl-based monomer through an addition reaction or a condensation reaction.

For example, the reactive black dye may contain an acrylate group or a methacrylate group.

For example, when methyl methacrylate, benzyl methacrylate methacrylic acid and the compound of Chemical Formula 1 react with each other to form an acryl resin, and when $R_1$ of the compound of Chemical Formula 1 represents —OCOCH=$CHCH_3$, the binder resin may be represented by the following Chemical Formula 4.

binder resin is greater than about 10% by weight may not be coated uniformly on the substrate. Thus, an amount of the binder resin may be, for example, about 3% by weight to about 10% by weight, based on the total weight of the photoresist composition.

(b) Monomer

The monomer may contain, for example, a double bond, and it may react with a radical generated by the photo-polymerization initiator. The monomer may react with the binder resin or an adjacent monomer to form a cross-linkage.

In an embodiment, the monomer may contain, for example, an acrylate group. Examples of the monomer may include, for example, a multi-functional monomer, a mono-functional monomer, or a combination of the multi-functional monomer and the mono-functional monomer.

The multi-functional monomer may include, for example, a plurality of acrylate residues. Examples of the multi-functional monomer may include, for example, at least one selected from dipentaerythritol hexaacrylate, pentaerythritol triacrylate, pentaerythritol tetraacrylate, trimethylpropane triacrylate, trimethylpropane trimethacrylate, glycerol triacrylate, tris(2-hydroxyethyl)isocyanurate triacrylate, di-trimethylpropane tetraacrylate, dipentaerythritol pentaacrylate, <Chemical Formula 4>

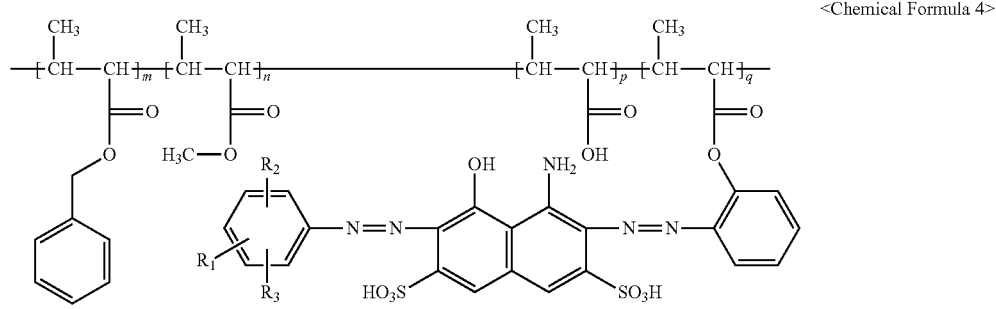

In Chemical Formula 4, m, n, p and q represents mole fractions of corresponding repeating units. Sum of m, n, p and q is 100, and m, n, p and q are integers more than 0. Furthermore, for example, $R_1$ represents —OCOCH=$CHCH_3$, and $R_2$ and $R_3$ independently represent —$NR_5R_6$, —$OR_7$, —$CR_8$=$CR_9R_{10}$ or —OC(=O)$CR_{11}$=$CR_{12}R_{13}$, and $R_5$ to $R_{13}$ independently represent a hydrogen atom or an alkyl group having carbon atoms of 1 to 5, and at least one hydrogen atoms of the alkyl group may be substituted with an alkyl group having carbon atoms of 1 to 20, an alkoxyl group having carbon atoms of 1 to 30, an aryl group having carbon atoms of 6 to 30 or an aryloxyl group having carbon atoms of 6 to 30.

For reaction of methyl methacrylate, benzyl methacrylate methacrylic acid and the compound of Chemical Formula 1, a catalyst such as, for example, azobisisobutyronitrile (AIBN), benzoyl peroxide (BPO) or the like may be used. The reaction may be performed at, for example, about 60° C. to about 100° C.

When an amount of the binder resin is less than about 3% by weight, based on the total weight of the photoresist composition, a shape stability of a coated layer formed by the photoresist composition may be low. Alternatively, when an amount of the binder resin is greater than about 10% by weight, based on the total weight of the photoresist composition, a viscosity of the photoresist composition may be increased, and a dispersibility in the solvent may be reduced. Thus, the photoresist composition wherein the amount of the and pentaerythritol tetraacrylate, and the like. These can be used alone or in a combination thereof.

A mono-functional monomer may include, for example, a single acrylate residue. Examples of the mono-functional monomer may include, for example, at least one selected from glycidyl methacrylate, hydroxyethyl methacrylate, 2-hydroxy-3-phenoxypropyl acrylate, diethylene glycol methyl ether methacrylate, hydroxyethyl acrylate, butyl methacrylate, hydroxypropyl acrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate, and tridecyl acrylate, and the like. These can be used alone or in combination thereof.

When an amount of the monomer is less than about 2% by weight, based on the total weight of the photoresist composition, a binding strength of the composition may be weakened and a shape stability of a photoresist pattern may be reduced. When an amount of the monomer is greater than about 10% by weight, based on the total weight of the photoresist composition, photo margins may not be suitably tuned. Thus, an amount of the monomer may be, for example, about 2% by weight to about 10% by weight, based on the total weight of the photoresist composition.

(c) Photo-Polymerization Initiator

The photo-polymerization initiator generates a radical when it is irradiated with the light. A curing reaction of the photoresist composition may be initiated by the radical.

Non-limiting examples of the photo-polymerization initiator may include, for example, at least one selected from an acetophenone-based compound, a benzophenone-based compound, an oxime-based compound and the like. For example, non-limiting examples of the photo-polymerization initiator may include at least one selected from acetophenone, 2,2-dimethoxy-2-phenylacetophenone, 4'-ethoxyacetophenone, 3'-hydroxyacetophenone, 3-hydroxyacetophenone, 4'-phenoxyacetophenone, benzophenone, 4-phenylbenzophenone and the like. These can be used alone or in combination thereof.

When an amount of the photo-polymerization initiator is less than about 0.5% by weight, based on the total weight of the photoresist composition, the reactivity of the photoresist composition with respect to irradiating light may be insufficient, and the photoreaction of the photoresist composition may be insufficient to cure the photoresist. When an amount of the photo-polymerization initiator is greater than about 5% by weight, it may be difficult to control a rate of the photoreaction. Thus, an amount of the photo-polymerization initiator in the photoresist composition may be, for example, about 0.5% by weight to about 5% by weight, based on the total weight of the photoresist composition.

(d) Solvent

The photoresist composition may further include, for example, a solvent. The solvent may disperse and/or solubilize the binder resin, the monomer and the photo-polymerization initiator to form a solution and/or a dispersion that may be coated on an object.

Non-limiting examples of the solvent may include, for example, at least one selected from propylene glycol monomethyl ether acetate, ethyl ethoxy propionate, cyclohexanone, dipropylene glycol monomethyl ether acetate, n-butylacetate, isobutyl acetate, ethylene glycol monomethyl acetate, ethylene glycol n-butyl acetate, diethylene glycol dimethyl ether, dipropylene glycol monomethyl acetate, diethylene glycol methyl ether, dipropylene glycol n-butyl ether, tripropylene glycol n-butyl ether, tripropylene glycol methyl ether, propylene glycol methyl ether acetate, propylene glycol diacetate, 3-ethoxy propionic acid methyl ester, methanol, ethanol, methyl cellosolve monomethyl ether, ethyl cellosolve acetate, diethylene glycol monomethyl ether, methylethyl ketone, 4-hydroxy-4-methyl-2-pentanone, and 2-hydroxy-2-methylproprionic acid ethyl ester, and the like. These can be used alone or in a combination thereof.

In an embodiment, an amount of the solvent is a remaining percentage of the photoresist composition, e.g. the difference between 100% and the sum of the amounts of the binder resin, the monomer and the photo-polymerization initiator. For example, an amount of the solvent may be about 75% by weight to about 94% by weight, based on the total weight of the photoresist composition. An amount of the solvent may be changed according to an amount of an additional component.

(e) Black Pigment

As the photoresist composition includes the binder resin combined with the black dye, the photoresist composition can form a black matrix. However, the black matrix may not have a sufficient optical density according to applications of the black matrix. The black pigment may increase an optical density of the black matrix.

Non-limiting examples of the black pigment may include, for example, at least one selected from carbon black, titanium black, acetylene black, aniline black, perylene black, strontium titanium oxide, chromium oxide, and cerium oxide, e.g., ceria, and the like. These can be used alone or in a combination thereof. For example, a particle size of the black-coloring agent may be about 60 mm to about 120 nm.

When an amount of the black-coloring agent is greater than about 10% by weight, curing of the photoresist composition may be difficult. Thus, an amount of the black-coloring agent may be, for example, no greater than about 10% by weight, based on the total weight of the photoresist composition.

(f) Dispersing Agent

The dispersing agent covers a surface of the black pigment so that cohesion between adjacent black pigments may be inhibited.

Non-limiting commercially available examples of the dispersing agent may include, for example, BYK-200 (available from BYK-chemie, Germany), BYK-2001 (available from BYK-chemie, Germany), BYK-161 (available from BYK-chemie, Germany), BYK-163 (available from BYK-chemie, Germany), BYK-160 (available from BYK-chemie, Germany), BYK-161 (available from BYK-chemie, Germany), PD-7000 (trade name, available from CRODA, Germany), DFKA-4330 (trade name, available from BASF, Germany), DISPERS-650 (available from Evonik, Germany), and the like. These can be used alone or in a combination thereof.

When an amount of the dispersing agent is greater than about 1% by weight, based on the total weight of the photoresist composition, the dispersing agent in the photoresist composition may reduce an optical density of the composition. Thus, an amount of the dispersing agent in the composition may be, for example, no greater than about 1% by weight, based on the total weight of the photoresist composition.

(g) Surfactant

The surfactant may decrease interfacial tension between a substrate and a coated layer formed by curing the photoresist composition. Thus, addition of the surfactant may result in the coated layer uniformly formed on the substrate. Non-limiting examples of the surfactant may include, for example, FZ-2110 (trade name, available from Dow Corning, U.S.), FZ-2122 (trade name, available from Dow Corning, U.S.), BYK-345 (trade name, available from BYK, U.S.), BYK346 (trade name, available from BYK, U.S.), or BYK-34 (trade name, available from BYK, U.S.), etc. The foregoing products may be used either alone or in a combination with each other.

(h) Adhesion Enhancer

When the substrate is, for example, a glass substrate, adhesion between the photoresist composition and the glass substrate may be increased by the adhesion enhancer. The adhesion enhancer may include, for example, at least one selected from a melamine cross-linking agent, a silane coupling agent having an organic functional group and an inorganic functional group.

Non-limiting examples of the silane coupling agent include, for example, KBM-303 (available from Shin-Etsu, Japan), KBM-403 (available from Shin-Etsu, Japan), KBE-402 (available from Shin-Etsu, Japan), or KBE-40 (available from Shin-Etsu, Japan), and the like. These can be used alone or in a combination with each other. Non-limiting examples of the melamine cross-linking agent may further include, for example, MW-30M (available from Vision Tech, Korea), MX706 (available from Vision Tech, Korea), and the like.

When an amount of the surfactant and the adhesion enhancer is greater than about 1% by weight, based on the total weight of the photoresist composition, a characteristic of a coated layer may be deteriorated. Thus, an amount of each of the surfactant and the adhesion enhancer may be, for example, no greater than about 1% by weight, based on the total weight of the photoresist composition.

Alternatively, in an embodiment, the photoresist composition may include, for example, a binder resin and a reactive black dye instead of the binder resin combined with the black dye.

The binder resin may be, for example, substantially the same as the previously explained binder resin except for not being combined with the black dye. Thus, the binder resin may be formed by, for example, polymerization of an acryl-based monomer, and the acrylic resin may be, for example, a copolymer formed by polymerization of at least two different monomers.

The reactive black dye may include compounds represented by, for example, the Chemical Formulas 1, 2, and 3. For example, the reactive black dye may be combined with the binder resin in the process of curing the photoresist composition to form the binder resin represented by Chemical Formula 4.

As stated above, the photoresist composition according to an exemplary embodiment includes a binder resin combined with a black dye or a reactive black dye that can be combined with a binder resin. Thus, the black dye may be prevented from being separated from the binder resin and the coated layer. Thus, a heat resistance, a light resistance and a chemical resistance of a black matrix may be increased.

Furthermore, the photoresist composition according to an exemplary embodiment may not use a black pigment or may use a reduced amount of the black pigment. Thus, a straight-ability, a profile, and an adhesion power to a substrate of a black matrix may be increased, and the black matrix may have a high electric resistance.

The photoresist composition according to an exemplary embodiment may be suitable for forming a black matrix but is not limited thereto. For example, in an exemplary embodiment, the photoresist composition may also be used for forming a light-blocking layer for various electronic devices.

Hereinafter, a method of forming a black matrix using the photoresist composition according to an exemplary embodiment of the present invention will be described in further detail with reference to the accompanying drawings.

FIGS. 1 to 4 are cross-sectional views illustrating a method of manufacturing a black matrix and a display substrate according to an embodiment.

Referring to FIG. 1, a photoresist composition may be, for example, coated on a base substrate 10 to form a coated layer 20 thereon. Non-limiting examples of the base substrate 10 may include, for example, a glass substrate, a soda lime substrate, and the like. Further, in an exemplary embodiment, the glass may include, for example, tempered glass. In an exemplary embodiment, the base substrate 10 may be formed of, for example, one of polycarbonate (PC), polyester (PET), polypropylene (PP), polyethylene (PE) and polymethyl methacrylate (PMMA).

In the present exemplary embodiment, base substrate 10 may be part of a color filter substrate of a display panel. However, alternatively, the base substrate 10 may be part of a thin film transistor array substrate of a display panel.

The photoresist composition may include, for example, a binder resin combined with a black dye, a monomer, a photo-polymerization initiator, and a solvent. Alternatively, in an embodiment, the photoresist composition may include, for example, a binder resin, a reactive black dye, a monomer, a photo-polymerization initiator, and a solvent.

The photoresist composition may further include, for example, at least one of a dispersing agent, a pigment, a surfactant and an adhesion enhancer.

The photoresist composition may be, for example, substantially the same as the photoresist composition described above. Thus, any duplicated explanation will be omitted here.

For example, a dipping method, a spraying method, or a spin coating may be used to form the coated layer 20. In an embodiment, the coated layer 20 may be, for example, pre-baked to at least partially remove the solvent in the photoresist composition.

Thereafter, the base substrate 10 having the coated layer 20 may be, for example, exposed to a light. For example, to selectively expose the coated layer 20 to a light, a mask including a light-transmitting portion corresponding to a light-exposing area LEA and a light-blocking portion corresponding to a light-blocking area LBA may be used. In an embodiment, the coated layer 20 may alternatively be selectively exposed to a light by a digital light-exposure device without the use of a mask.

When the coated layer 20 is exposed to a light, the photoresist composition in the light-exposing area LEA is cured. For example, the binder resin and the monomer are cross-linked to cure the photoresist composition. When the photoresist composition includes a binder resin, a reactive black dye, a monomer, a photo-polymerization initiator, and a solvent, the reactive black dye reacts with the binder resin to be combined with the binder resin.

Figure 2:
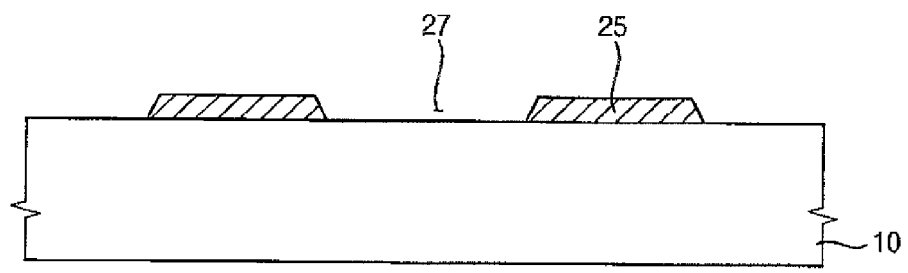

Referring to FIG. 2, a portion of the coated layer 20, which was not exposed to the light, may be, for example, removed to form a black matrix 25.

For example, when a developer such as an alkali solution is provided to the coated layer 20, the coated layer 20 in the light exposure area LEA remains on the base substrate 10, and the coated layer 20 in the light blocking area LBA is dissolved by the developer. Accordingly, the coated layer 20 may be removed from the base substrate 10. As a result, the black matrix 25 may be formed by a remaining coated layer. The developer may be provided through, for example, a dipping method, a spraying method, or the like.

In an embodiment, after the coated layer 20 in the light blocking area LBA has been removed, the black matrix 25 may be, for example, post-baked to enhance adhesion.

The black matrix 25 may include, for example, a first stripe pattern extending in a first direction on the base substrate 10, and a second stripe pattern extending in a second direction crossing the first direction thereby defining a plurality of openings 27 arranged in a matrix configuration.

As the photoresist composition includes a binder resin combined with a black dye or a reactive black dye that can react with a binder resin in the process of exposing a coated layer to a light, a black dye and a binder resin are chemically combined with each other in the black matrix 25. Thus, a heat resistance, a light resistance and a chemical resistance of a black matrix may be increased, and the black matrix may have a high electric resistance.

For example, a specific resistance of the black matrix may be about $10^3$ $\Omega \cdot m$ to about $10^{14}$ $\Omega \cdot m$. Furthermore, an optical density of the black matrix may be, for example, about 3.0 to about 5.0 per 1 μm of a thickness.

Figure 3:
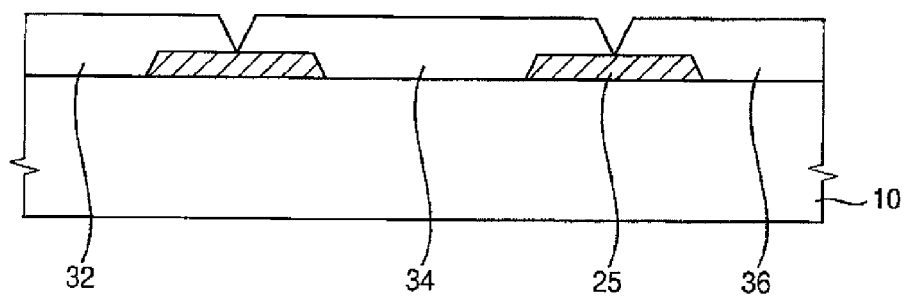

Referring to FIG. 3, a color filter may be formed on, for example, the base substrate 10 having the black matrix 25. The color filter may, for example, fill the openings 27 defined by the black matrix 25 and may overlap with at least a portion of the black matrix 25. Alternatively, in an exemplary embodiment, the color filter may instead be formed on a different substrate of the display panel than the base substrate 10 having the black matrix 25.

Referring back to the present exemplary embodiment of FIG. 3, the color filter may include, for example, a plurality of color filters having different colors. For example, the plurality of color filters may include a first color filter 32 having a red pigment, a second color filter 34 having a green pigment, and a third color filter 36 having a blue pigment. The first, second, and third color filters 32, 34 and 36 may respectively be formed from photoresist compositions which are different from each other.

For example, in an embodiment, a first photoresist composition including a red pigment may be coated on the base substrate 10, and then exposed to a light and developed to form the first color filter 32. Subsequently, a second photoresist composition including, for example, a green pigment may be coated on the base substrate 10, and then exposed to a light and developed to form the second color filter 34. Furthermore, a third photoresist composition including, for example, a blue pigment may be coated on the base substrate 10, and then exposed to a light and developed to form the third color filter 36. The first, second, and third color filters 32, 34 and 36 may, for example, partially overlap with each other.

The first, second and third color filters 32, 34 and 36 may be formed by, for example, consequently irradiating the photoresist composition including an appropriate pigment with a digital light-exposure device or a conventional light-exposure device using a mask.

It is noted that the color filters are not limited to only red, green, and blue color filters but rather in an exemplary embodiment the color filters may also include other colors such as cyan, yellow, or magenta.

Figure 4:
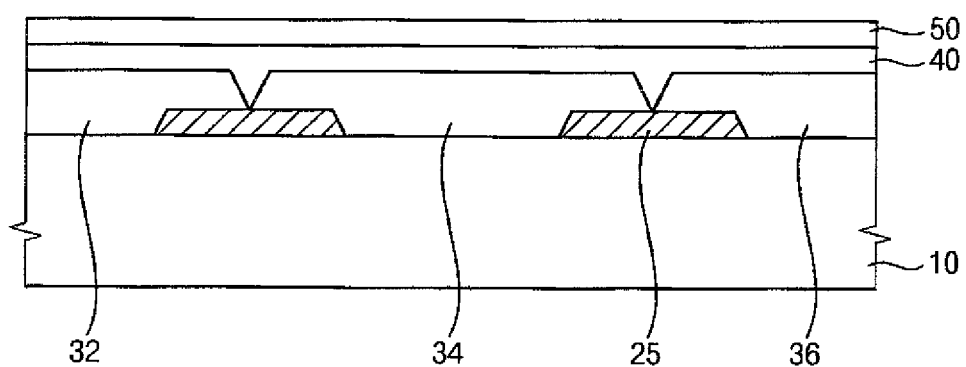

Referring to FIG. 4, a planarizing layer 40 and a transparent electrode 50 may be formed, for example, to cover the color filters. The planarizing layer 40 may compensate for a step due to the color filters to planarize the base substrate 10. The transparent electrode 50 may be formed on the planarizing layer 40, and the transparent electrode 50 may function as a common electrode.

In an embodiment, the planarizing layer 40 may include, for example, an organic insulation layer including an acrylic resin, a phenol resin, a polyimide resin, an epoxy resin, a polyamide resin, a benzocyclobutene (BCB) resin, or the like.

The transparent electrode 50 may include, for example, at least one material selected from indium tin oxide ("ITO"), and indium zinc oxide ("IZO"), aluminum doped ZnO (AZO), cadmium zinc oxide (CZO), indium gallium zinc oxide (IGZO), another suitable material, or a combination of the above.

In an embodiment, the black matrix may be formed, for example, with the color filter and the common electrode on a same substrate. In an embodiment, at least one of the color filter and the common electrode may alternatively be omitted. Alternatively, the black matrix may be formed on an array substrate including a thin film transistor array.

Having described the exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A photoresist composition, comprising:
a binder resin bonded to a black dye;
a monomer;
a photo-polymerization initiator; and
a remainder of a solvent, wherein the binder resin is represented by following Chemical Formula 4, wherein m, n, p and q represents mole fractions of corresponding repeating units, and sum of m, n, p and q is 100, and m, n, p and q are integers more than 0, and $R_1$ represents —OCOCH=CHCH$_3$, and $R_2$ and $R_3$ independently represent —NR$_5$R$_6$, —OR$_7$, —CR$_8$=CR$_9$R$_{10}$ or —OC(=O)CR$_{11}$=CR$_{12}$R$_{13}$, and $R_5$ to $R_{13}$ independently represent a hydrogen atom or an alkyl group having carbon atoms of 1 to 5, and at least one hydrogen atoms of the alkyl group may be substituted with an alkyl group having carbon atoms of 1 to 20, an alkoxyl group having carbon atoms of 1 to 30, an aryl group having carbon atoms of 6 to 30 or an aryloxyl group having carbon atoms of 6 to 30,

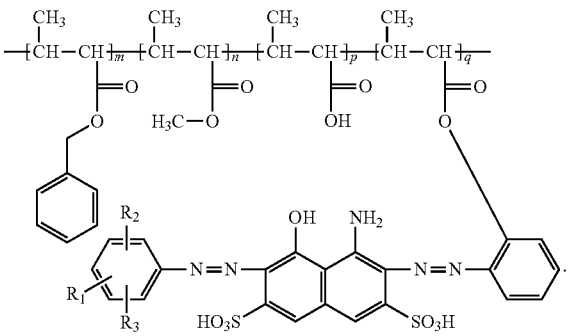

<Chemical Formula 4>

2. The photoresist composition of claim 1, wherein the binder resin comprises an acryl resin having a weight-average molecular weight of about 10,000 to about 100,000.

3. The photoresist composition of claim 2, wherein the binder resin is a product of polymerization of an acryl-based monomer and a reactive black dye.

4. The photoresist composition of claim 3, wherein the acryl-based monomer comprises at least one selected from the group consisting of methacrylic acid, acrylic acid, crotonic acid, maleic acid, vinyl pyrrolidone, styrene monomer, methyl methacrylate, benzyl methacrylate, 2-hydroxyethyl methacrylate, an aryl methacrylate, and glycidyl methacrylate.

5. The photoresist composition of claim 3, wherein the reactive black dye comprises at least one selected from the group consisting of compounds represented by following Chemical Formulas 1 to 3, wherein $R_1$, $R_2$, $R_3$, and $R_4$ independently represent —NR$_5$R$_6$, —OR$_7$, —CR$_8$=CR$_9$R$_{10}$ or —OC(=O)CR$_{11}$=CR$_{12}$R$_{13}$, $R_5$ to $R_{13}$ independently represent a hydrogen atom or an alkyl group having carbon atoms of 1 to 5, and at least one hydrogen atoms of the alkyl group may be substituted with an alkyl group having carbon atoms of 1 to 20, an alkoxyl group having carbon atoms of 1 to 30, an aryl group having carbon atoms of 6 to 30 or an aryloxyl group having carbon atoms of 6 to 30, <Chemical Formula 1>

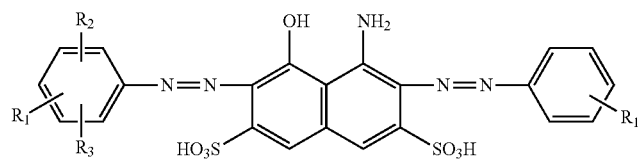

<Chemical Formula 2>

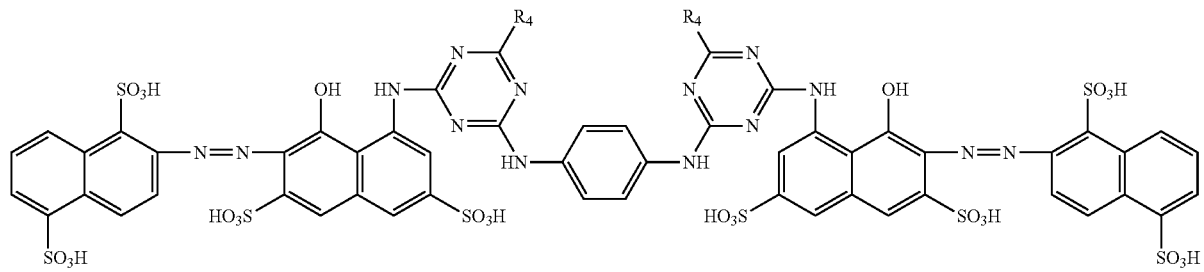

<Chemical Formula 3>

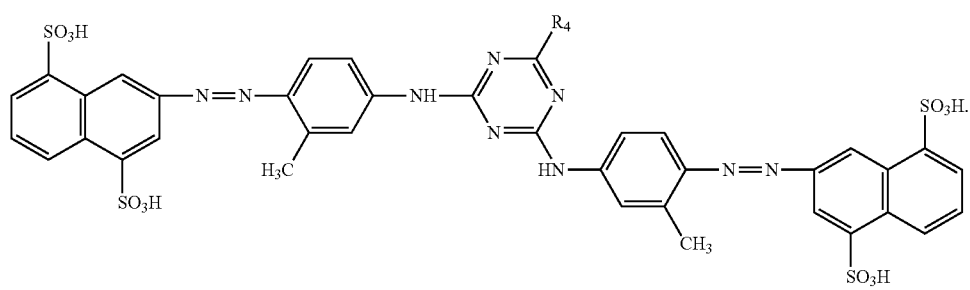

6. The photoresist composition of claim 1, wherein the monomer comprises at least one selected from the group consisting of dipentaerythritol hexaacrylate, pentaerythritol triacrylate, pentaerythritol tetraacrylate, trimethylpropane triacrylate, trimethylpropane trimethacrylate, glycerol triacrylate, tris(2-hydroxyethyl)isocyanurate triacrylate, di-trimethylpropane tetraacrylate, dipentaerythritol pentaacrylate, pentaerythritol tetraacrylate, glycidyl methacrylate, hydroxyethyl methacrylate, 2-hydroxy-3-phenoxypropyl acrylate, diethylene glycol methyl ether methacrylate, hydroxyethyl acrylate, butyl methacrylate, hydroxypropyl acrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate, and tridecyl acrylate.

7. The photoresist composition of claim 1, wherein the photo-polymerization initiator comprises at least one selected from the group consisting of an acetophenone-based compound, a benzophenone-based compound and an oxime-based compound.

8. The photoresist composition of claim 1, further comprising a black pigment.

9. The photoresist composition of claim 8, wherein the black pigment comprises at least one selected from the group consisting of carbon black, titanium black, acetylene black, aniline black, perylene black, strontium titanium oxide, chromium oxide, and ceria.

10. The photoresist composition of claim 1, further comprising at least one selected from the group consisting of a dispersing agent, a surfactant and an adhesion enhancer.

11. The photoresist composition of claim 1, wherein an amount of the binder resin bonded to the black dye is about 3% by weight to about 10% by weight, an amount of the monomer is about 2% by weight to about 10% by weight, an amount of the photo-polymerization initiator is about 0.5% by weight to about 5% by weight.

12. A photoresist composition, comprising:
a binder resin;
a reactive black dye;
a monomer;
a photo-polymerization initiator; and
a remainder of a solvent,
wherein the binder resin is represented by following Chemical Formula 4, wherein m, n, p and q represents mole fractions of corresponding repeating units, and sum of m, n, p and q is 100, and m, n, p and q are integers more than 0, and $R_1$ represents —OCOCH=CHCH$_3$, and $R_2$ and $R_3$ independently represent —NR$_5$R$_6$, —OR$_7$, —CR$_8$=CR$_9$R$_{10}$ or —OC(=O)CR$_{11}$=CR$_{12}$R$_{13}$, and $R_5$ to $R_{13}$ independently represent a hydrogen atom or an alkyl group having carbon atoms of 1 to 5, and at least one hydrogen atoms of the alkyl group may be substituted with an alkyl group having carbon atoms of 1 to 20, an alkoxyl group having carbon atoms of 1 to 30, an aryl group having carbon atoms of 6 to 30 or an aryloxyl group having carbon atoms of 6 to 30, <Chemical Formula 4>

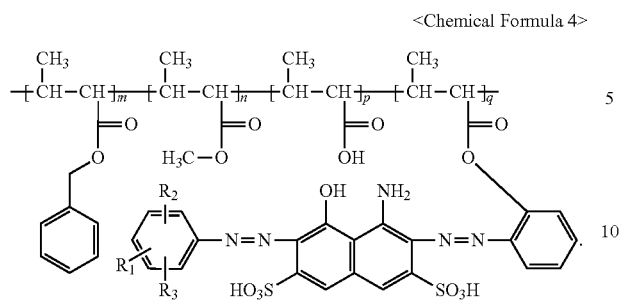

13. The photoresist composition of claim 12, wherein the binder resin comprises an acryl resin having a weight-average molecular weight of about 10,000 to about 100,000.

14. The photoresist composition of claim 12, wherein the reactive black dye comprises at least one selected from the group consisting of compounds represented by following Chemical Formulas 1 to 3, wherein $R_1$, $R_2$, $R_3$, and $R_4$ independently represent $-NR_5R_6$, $-OR_7$, $-CR_8=CR_9R_{10}$ or $-OC(=O)CR_{11}=CR_{12}R_{13}$, $R_5$ to $R_{13}$ independently represent a hydrogen atom or an alkyl group having carbon atoms of 1 to 5, and at least one hydrogen atoms of the alkyl group may be substituted with an alkyl group having carbon atoms of 1 to 20, an alkoxyl group having carbon atoms of 1 to 30, an aryl group having carbon atoms of 6 to 30 or an aryloxyl group having carbon atoms of 6 to 30, 15. A liquid crystal display panel, comprising:
a first substrate;
a second substrate facing the first substrate;
a liquid crystal layer interposed between the first and second substrates;
a color filter disposed on either the first or second substrates; and
a black matrix defining a plurality of openings for the color filter,
wherein the black matrix includes an acryl binder resin bonded to a black dye.

16. The liquid crystal display panel of claim 15, wherein the acryl binder resin is represented by following Chemical Formula 4, wherein m, n, p and q represents mole fractions of corresponding repeating units, and sum of m, n, p and q is 100, and m, n, p and q are integers more than 0, and $R_1$ represents $-OCOCH=CHCH_3$, and $R_2$ and $R_3$ independently represent $-NR_5R_6$, $-OR_7$, $-CR_8=CR_9R_{10}$ or $-OC(=O)CR_{11}=CR_{12}R_{13}$, and $R_5$ to $R_{13}$ independently represent a hydrogen atom or an alkyl group having carbon atoms of 1 to 5, and at least one hydrogen atoms of the alkyl group may be substituted with an alkyl group having carbon atoms of 1 to 20, an alkoxyl group having carbon atoms of 1 to 30, an aryl group having carbon atoms of 6 to 30 or an aryloxyl group having carbon atoms of 6 to 30, <Chemical Formula 1>

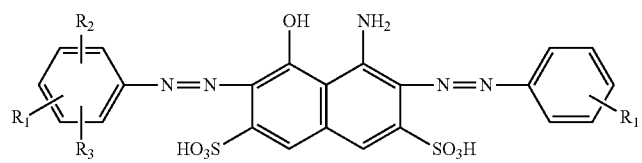

<Chemical Formula 2>

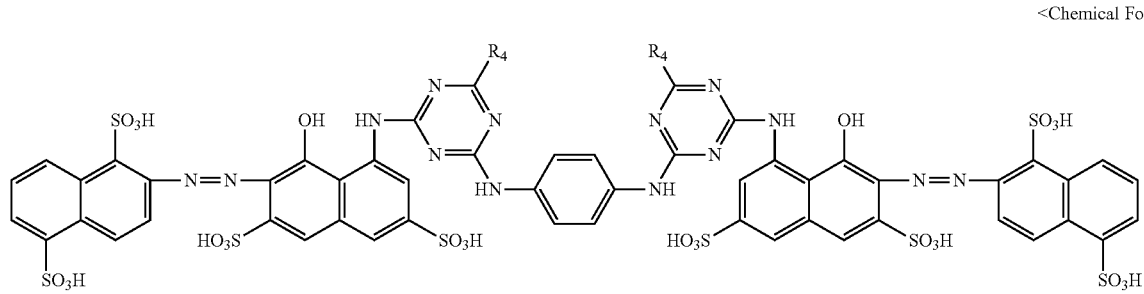

<Chemical Formula 3>

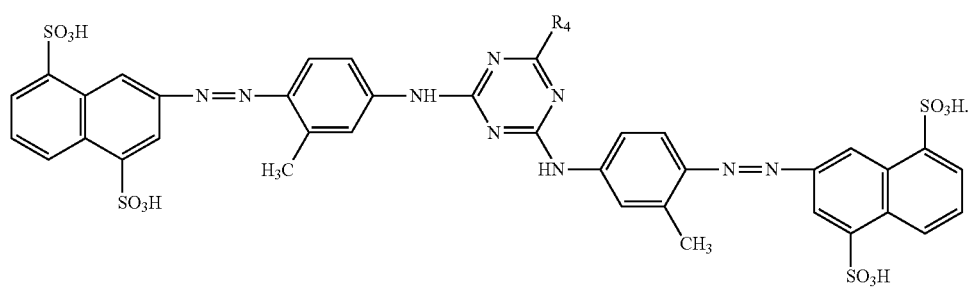

<Chemical Formula 4>

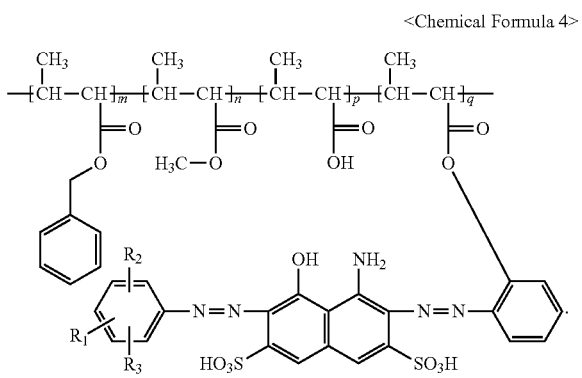

17. The liquid crystal display panel of claim 15, wherein the acryl binder resin has a weight-average molecular weight of about 10,000 to about 100,000.

18. The liquid crystal display panel of claim 15, wherein the acryl binder resin is a product of polymerization of an acryl-based monomer and a reactive black dye, and the reactive black dye comprises at least one selected from the group consisting of compounds represented by following Chemical Formulas 1 to 3, wherein $R_1$, $R_2$, $R_3$, and $R_4$ independently represent —$NR_5R_6$, —$OR_7$, —$CR_8$=$CR_9R_{10}$ or —$OC(=O)CR_{11}$=$CR_{12}R_{13}$, $R_5$ to $R_{13}$ independently represent a hydrogen atom or an alkyl group having carbon atoms of 1 to 5, and at least one hydrogen atoms of the alkyl group may be substituted with an alkyl group having carbon atoms of 1 to 20, an alkoxyl group having carbon atoms of 1 to 30, an aryl group having carbon atoms of 6 to 30 or an aryloxyl group having carbon atoms of 6 to 30, <Chemical Formula 1>

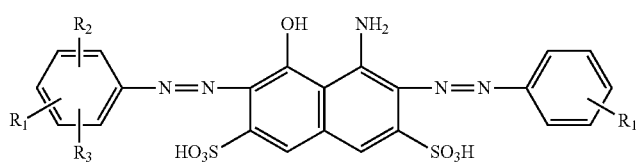

<Chemical Formula 2>

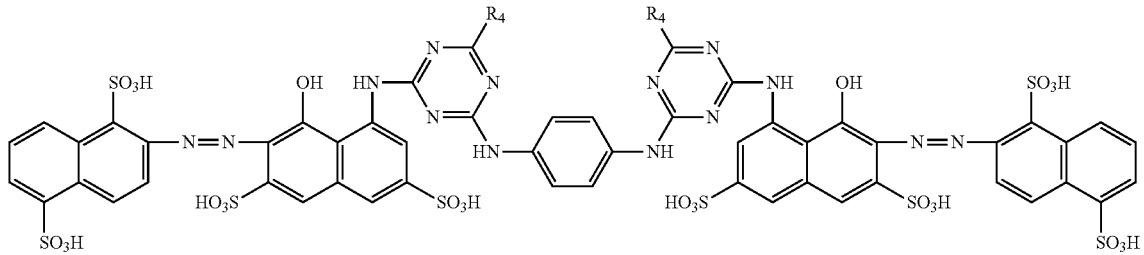

<Chemical Formula 3>

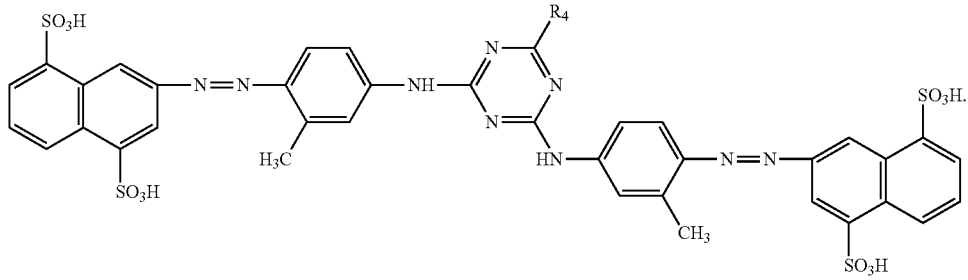

\* \* \* \* \*